US006767798B2

(12) United States Patent
Kalnitsky et al.

(10) Patent No.: US 6,767,798 B2
(45) Date of Patent: Jul. 27, 2004

(54) METHOD OF FORMING SELF-ALIGNED NPN TRANSISTOR WITH RAISED EXTRINSIC BASE

(75) Inventors: Alexander Kalnitsky, Portland, OR (US); Alexei Shatalov, Beaverton, OR (US); Michael Rowlandson, Portland, OR (US); Sang H. Park, Portland, OR (US); Robert F. Scheer, Portland, OR (US); Fanling H. Yang, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/119,594

(22) Filed: Apr. 9, 2002

(65) Prior Publication Data

US 2003/0189239 A1 Oct. 9, 2003

(51) Int. Cl.[7] .................. H01L 21/331; H01I 21/3205
(52) U.S. Cl. .................. 438/341; 438/349; 438/350; 438/357; 438/363; 438/592
(58) Field of Search ................. 438/481, 341, 438/349, 350, 357, 363, 592; 257/592

(56) References Cited

U.S. PATENT DOCUMENTS

| | | | |
|---|---|---|---|
| 4,157,269 A | | 6/1979 | Ning et al. |
| 4,871,684 A | | 10/1989 | Glang et al. |
| 4,879,255 A | | 11/1989 | Deguchi et al. |
| 4,980,738 A | | 12/1990 | Welch et al. |
| 5,061,652 A | | 10/1991 | Bendernagel et al. |
| 5,117,271 A | * | 5/1992 | Comfort et al. ............ 257/198 |
| 5,159,429 A | | 10/1992 | Bendernagel et al. |
| 5,244,821 A | | 9/1993 | Ham et al. |
| 5,320,972 A | | 6/1994 | Wylie |
| 5,340,753 A | | 8/1994 | Bassous et al. |
| 5,516,708 A | | 5/1996 | Li et al. |
| 5,516,710 A | | 5/1996 | Boyd et al. |
| 5,599,723 A | * | 2/1997 | Sato ............ 438/320 |
| 5,773,350 A | * | 6/1998 | Herbert et al. ............ 438/364 |
| 5,804,486 A | | 9/1998 | Zambrano et al. |
| 5,930,635 A | | 7/1999 | Bashir et al. |
| 6,153,488 A | * | 11/2000 | Yoshino ............ 438/345 |
| 6,180,442 B1 | | 1/2001 | Gris |
| 6,190,984 B1 | | 2/2001 | Ryum et al. |
| 6,218,711 B1 | | 4/2001 | Yu |
| 6,287,930 B1 | | 9/2001 | Park |
| 6,376,322 B1 | | 4/2002 | Gris |
| 6,492,237 B2 | * | 12/2002 | Kalnitsky et al. ............ 438/309 |
| 2002/0132438 A1 | * | 9/2002 | Dunn et al. ............ 438/343 |
| 2003/0057458 A1 | * | 3/2003 | Freeman et al. ............ 257/273 |

OTHER PUBLICATIONS

S.M. Sze, VLSI Technology, pp. 51–129 & 448–461, 1983, McGraw–Hill Book Company.
M. Racanelli, et al., Ultra High Speed SiGe NPN for Advanced BiCMOS Technology, Silicon RF Platform Technologies, Conexant Systems, Inc. Newport Beach, CA.
Stanley Wolf, et al., Silicon Processing for the VLSI Era, Lattice Press, Sunset Beach, CA pp. 191–194, 1986.

* cited by examiner

*Primary Examiner*—W. David Coleman
*Assistant Examiner*—William M. Brewster
(74) *Attorney, Agent, or Firm*—Blakely, Sokoloff, Taylor & Zafman LLP

(57) ABSTRACT

A self-aligned bipolar transistor and a method of formation thereof are provided. The bipolar transistor has a raised extrinsic base such that the link base resistance is reduced by providing an extrinsic base which is thicker than the intrinsic base. The increase in thickness of the extrinsic base provides a less resistive layer of the heavily doped base region. The method of forming the bipolar transistor includes depositing a first epitaxial layer on a substrate to form a base region having an intrinsic base region and an extrinsic base region. The extrinsic base region is raised by depositing a second epitaxial layer over a portion of the first epitaxial layer such that the thickness of the extrinsic base layer is x and the thickness of the intrinsic layer is y, wherein x>y. The second epitaxial layer is deposited using a chemical vapor epitaxial device where the concentration of Ge to Si is gradually reduced from above 5% to close to 0% during the epitaxy process. As such, the second epitaxy layer has the highest concentration of Ge near the interface of the first and second epitaxy layer. The concentration of Ge is gradually reduced to near 0% at the top surface of the second epitaxy region.

17 Claims, 11 Drawing Sheets

METHOD OF FORMING SELF-ALIGNED NPN TRANSISTOR WITH RAISED EXTRINSIC BASE

FIELD OF THE INVENTION

This invention relates generally to semiconductor processing, and in particular, to a method of forming a self-aligned bipolar transistor with a raised extrinsic base.

BACKGROUND OF THE INVENTION

Processes are known for fabrication of bipolar transistors having an extrinsic base region self-aligned to the sacrificial emitter structure. One example of such a process is described by M. Racanelli et al. in an article entitled "Ultra High Speed SiGe NPN for Advanced BiCMOS Technology", in the IEDM-2001 proceedings. Link base and extrinsic base implants are blocked from penetration in the intrinsic device area by the sacrificial emitter feature and the sacrificial emitter feature with a side wall spacer, respectively. Heavy p-type implants required to convert epitaxially deposited base material into a low resistivity extrinsic base region result in the generation of interstitial defects in the single crystal portion of the extrinsic base. The presence of interstitial defects promotes the transient enhanced diffusion of boron from the extrinsic base region into the intrinsic base during subsequent thermal processing. Interstitial defects also promote transient diffusion of the boron incorporated in the epitaxial base layer which leads to the effective base widening and the device speed reduction.

Another problem associated with the fabrication of higher speed bipolar transistors is the need to form thinner base films, which directly translates into a high base resistance. FIG. 1 illustrates a cross-sectional view of a typical npn bipolar transistor. The extrinsic link base region ($R_{bshl}$) comprises a thin Si, SiGe or SiGe:C epitaxial layer as used in the intrinsic base. Although heavily doped, this region will have higher resistance for thinner base films (faster transistors).

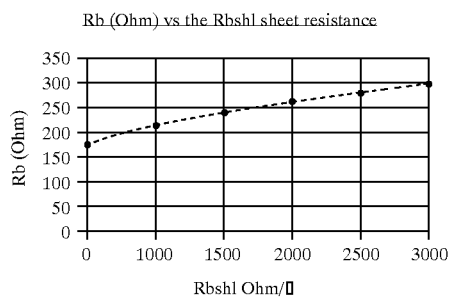

The graph shown above illustrates the calculated dependence of base resistance $R_b$ on the link base sheet resistance ($R_{bshl}$) for a given device geometry. A factor of three redution in the link base resistance ($R_{bshl}$) will result in a significant (approximately 80 ohm) reduction in base resistance ($R_b$).

In view of the above, it is apparent that there is a need to provide a high speed bipolar transistor and a method of fabricating a high speed bipolar transistor which reduces or avoids the above mentioned problems.

SUMMARY OF THE INVENTION

In accordance with the invention, a new and improved bipolar transistor and a method of forming same is provided.

The bipolar transistor has a raised extrinsic base such that the link base resistance is reduced by providing an extrinsic base which is thicker than the intrinsic base. The increase in thickness of the extrinsic base provides a less resistive layer of the heavily doped link base region.

The method of forming the bipolar transistor includes depositing a first epitaxial layer on a substrate to form a base region having an intrinsic base region and an extrinsic base region. The extrinsic base region is raised by depositing a second epitaxial layer over a portion of the first epitaxial layer such that the thickness of the extrinsic base layer is x and the thickness of the intrinsic layer is y, wherein x>y.

The second epitaxial layer is deposited using a chemical vapor epitaxial device where heavily p-type (e.g. boron) doped silicon is deposited selectively on exposed silcon surfaces. In order to improve process selectivity, a heavily p-type doped SiGe may be optionally deposited, where the concentration of Ge to Si is gradually reduced from above 5% to close to 0% during the epitaxy process. As such, the second epitaxy layer has the highest concentration of Ge near the interface of the first epitaxy layer and the second epitaxy layer. The concentration of Ge is gradually reduced to near 0% at the top surface of the second epitaxy region.

Other aspects, features and techniques of the invention will become apparent to one skilled in the relevant art in view of the following detailed description of the invention.

DETAILED DESCRIPTION OF THE INVENTION

Figure 1:
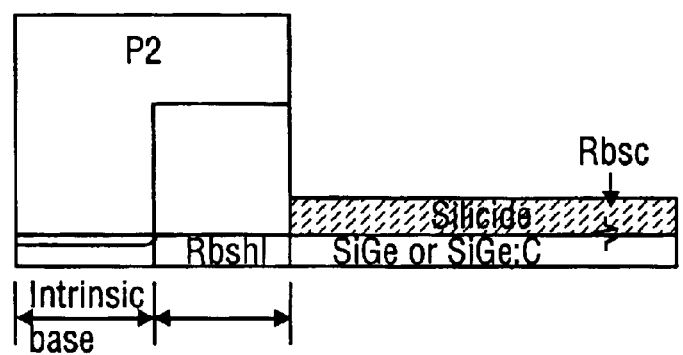
FIG. 1 illustrates a partial cross-sectional view of a typical prior art npn bipolar transistor
Figure 2:
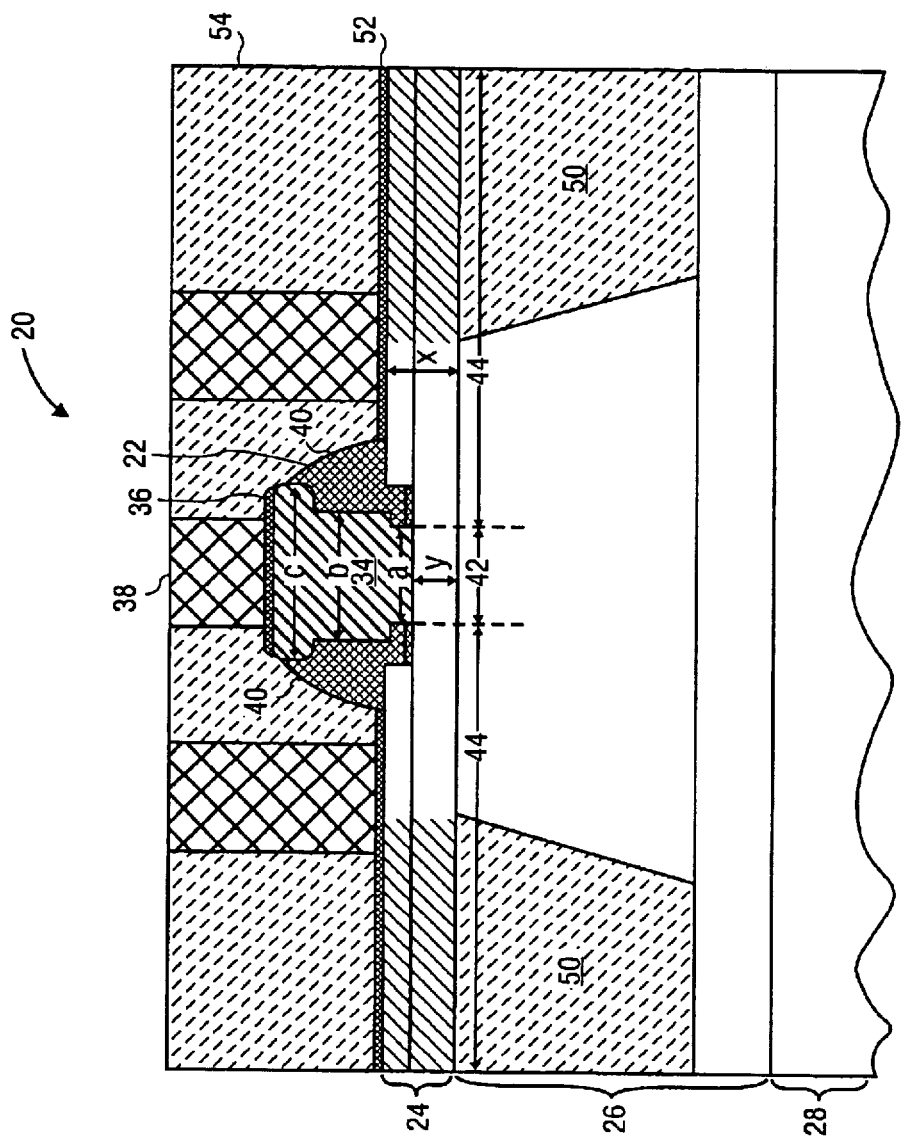
FIG. 2 illustrates a partial cross-sectional view of a npn bipolar transistor in accordance with the invention.

FIG. 2 illustrates a cross-sectional view of a npn bipolar transistor 20 in accordance with the invention. The bipolar transistor 20 has a n-type emitter region 22, a p-type base region 24, and an n-type collector region 26. The bipolar transistor 20 comprises a p-type substrate 28 and a p-type Si, SiGe or SiGe:C epitaxial layer. It shall be understood that the substrate, emitter region, base region, and collector region may be doped with the opposite conductivity, i.e. the substrate may be n-type, the emitter may be p-type, the base region may be n-type, and the collector region may p-type.

The emitter region 22 comprises a polysilicon emitter 34 having a first portion with a width a, a second portion with a width b, and a third portion with a width c wherein c>b>a. The first portion defines an emitter base junction having the width a, and the third portion defines the emitter contact region having the width c. A surface of the emitter contact region includes a refractory metal silicide layer 36 such as $CoSi_2$ or $TiSi_2$ to reduce contact resistance with an emitter contact 38. Emitter spacers 40 directly abut the walls of the polysilicon emitter 34. In the exemplary embodiment, the emitter spacers 40 are formed from a dielectric such as silicon dioxide or silicon nitride.

The base region 24 has an intrinsic base region 42 and an extrinsic base region 44. As can be seen in FIG. 2, the extrinsic base region 44 is raised relative to the intrinsic base region 42. The base region 24 may be further defined as comprising a mono crystalline portion and a poly crystalline portion. The mono crystalline portion is directly over the mono crystalline portion of the substrate 28 and the poly crystalline portion is supported by an oxide layer 50. A surface of the extrinsic base region 44 is raised relative to the surface of the intrinsic base region 42 outside of the intrinsic base region 42. The extrinsic base region 44 has a thickness x and the intrinsic base region has a thickness y, wherein x>y. The base regions 24 further includes a refractory metal silicide layer 52 such as $CoSi_2$ or $TiSi_2$ to reduce contact resistance with base contacts. The surface of the bipolar transistor is coated with an interlayer insulating film 54 such as silicon dioxide.

Figure 3A:
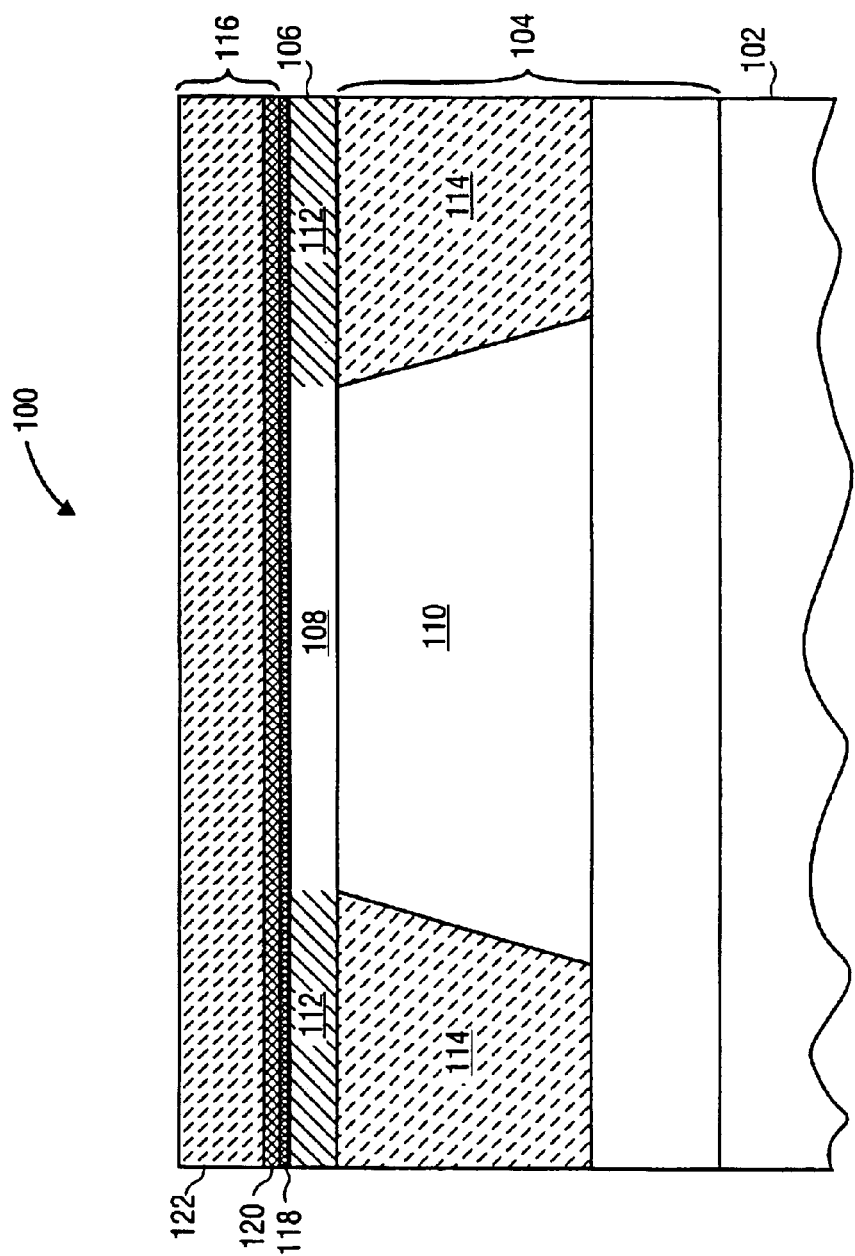
FIG. 3A illustrates a cross-sectional view of an exemplary semiconductor device shown at a step of an exemplary method of forming a npn bipolar transistor in accordance with the invention.

FIG. 3A illustrates a cross-sectional view of an exemplary semiconductor device 100 at a step of an exemplary method of forming a bipolar transistor in accordance with the invention. At this step, the semiconductor device 100 comprises a p-type Si substrate 102 having a n-type collector region 104 and a p-type Si, SiGe or SiGe:C epitaxial layer 106. The epitaxial layer 106 is deposited over the surface of the substrate 102 such that a mono crystalline portion 108 of the epitaxial layer 106 is deposited over the mono crystalline portion 110 of the substrate 102 and a poly crystalline portion 112 of the epitaxial layer 106 is deposited over an oxide layer 114 of the substrate 102. It is noted that the epitaxial layer 106 may comprise multiple layers such as a lower p-type layer doped with boron and a thin n-type layer doped with arsenic.

An ONO (oxide-nitride-oxide) stack 116 is formed on the substrate 102, wherein the thickness of the ONO (oxide-nitride-oxide) stack determines the final height of the polysilicon emitter. The ONO (oxide-nitride-oxide) stack 116 comprises a thin silicon dioxide layer 118, a silicon nitride layer 120, and a top silicon dioxide layer 122. The thin silicon dioxide layer 118 is thermally grown over the epi- taxial layer 106 to a sufficient thickness to serve as an etch stop for silicon nitride reactive ion etch. The silicon nitride layer 120 may be deposited by low-pressure-chemical-vapor-deposition (LPCVD) or other processes known to one skilled in the art to a thickness ranging from about 50 to 500 Angstroms, and the top silicon dioxide layer 122 may be deposited by PECVD to a thickness ranging from about 1,000 to 10,000 Angstroms.

Figure 3B:
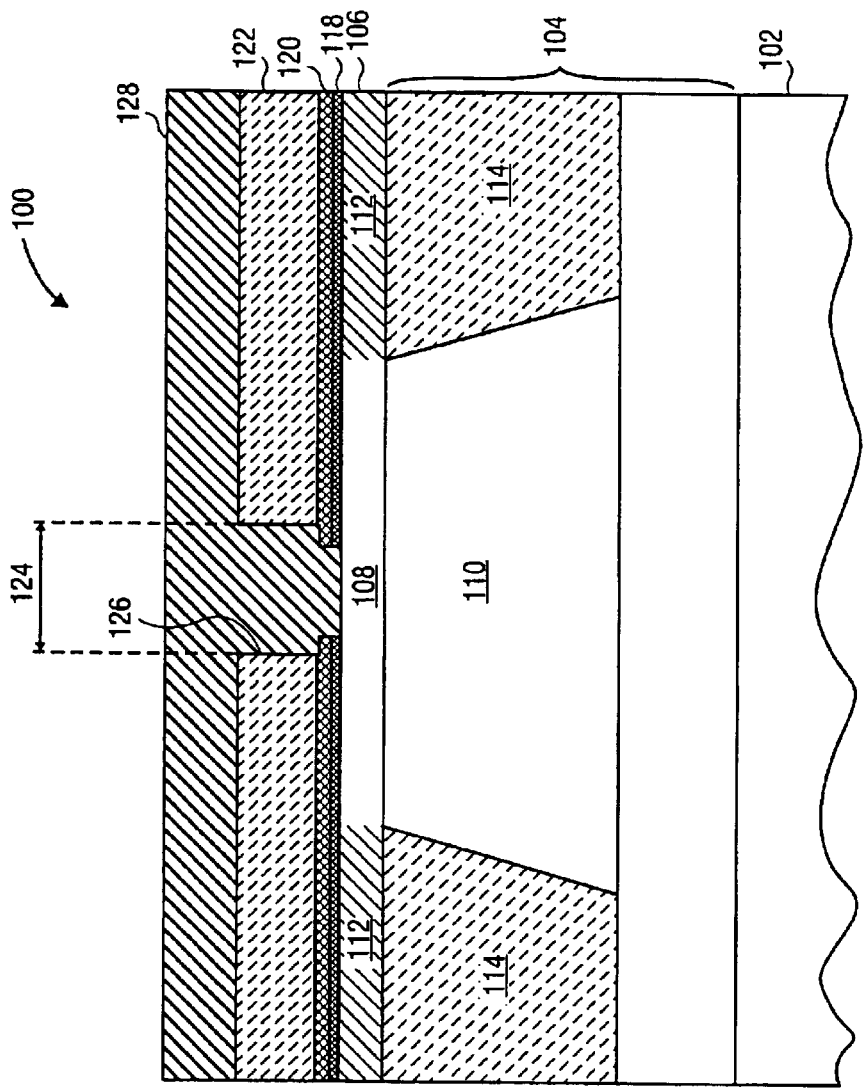
FIG. 3B illustrates a cross-sectional view of the exemplary semiconductor device shown at a subsequent step of the exemplary method of forming the npn bipolar transistor in accordance with the invention.

FIG. 3B illustrates a cross-sectional view of the exemplary semiconductor device 100 at a subsequent step of the exemplary method of forming a bipolar transistor in accordance with the invention. At this subsequent step, an emitter mask layer is formed over the top silicon dioxide layer 122. The emitter mask layer may be formed of photo resist material or other materials that can serve as a mask for a subsequent process of selectively etching the top silicon dioxide layer 122 and the underlying silicon nitride layer 120 to form an emitter window 124. The thin silicon dioxide layer 118 is left in place to protect the surface of a base region from contamination and to improve implant uniformity. A self-aligned collector implant is then performed by ion implanting an n-type dopant such as arsenic or phosphorous through the emitter window 124 using implant energies ranging from 80 keV to 200 keV at a dose ranging from 1E12 to 5E13 $cm^{-2}$. The n-type ions pass through the base region to form a narrow medium doped region just below the base region and self aligned to the emitter window 124. After performing the ion implant, the thin oxide layer 118 is wet etched at the emitter window 124 by a HF dip. During the wet etching, side walls 126 of the top silicon dioxide layer 122 are also etched and pulled back. A layer of polysilicon 128 is deposited onto the substrate 102. In the exemplary method, the polysilicon layer 128 may be in situ doped with n-type dopant while deposited by low-pressure-chemical-vapor-deposition (LPCVD), epitaxial silicon reaction, or other processes known in the art.

Figure 3C:
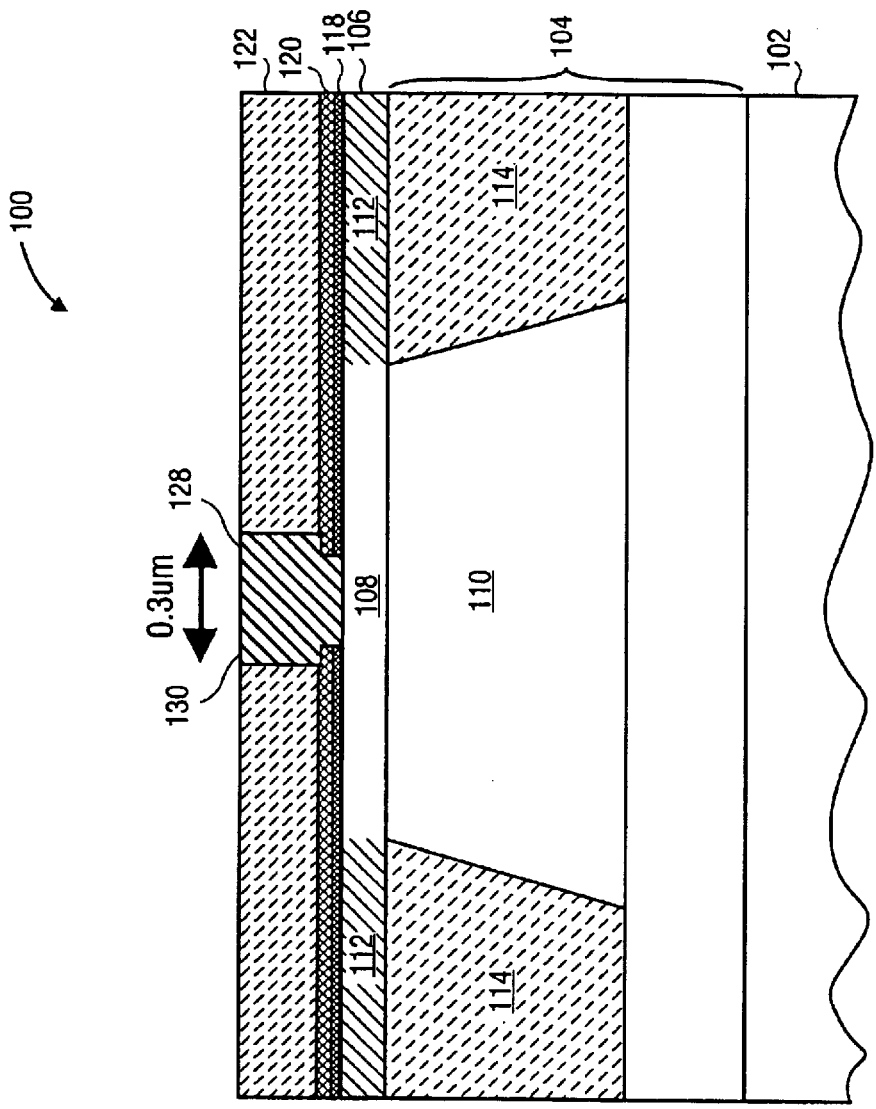
FIG. 3C illustrates a cross-sectional view of the exemplary semiconductor device shown at another subsequent step of the exemplary method of forming the npn bipolar transistor in accordance with the invention.

FIG. 3C illustrates a cross-sectional view of the exemplary semiconductor device 100 at another subsequent step of the exemplary method of forming a bipolar transistor in accordance with the invention. In this subsequent step, a polysilicon emitter 130 is formed by etching back the polysilicon layer 128, wherein the top surface of the polysilicon layer 128 is coplanar to the top surface of the top silicon dioxide layer 122 after the etch back is completed. In the exemplary method, the polysilicon layer 128 is isotropically etched back by reactive plasma ion etching. As an alternative, the polysilicon layer 128 may be etched back by a combined process which includes chemical mechanical polishing (CMP) and etch back.

Figure 3D:
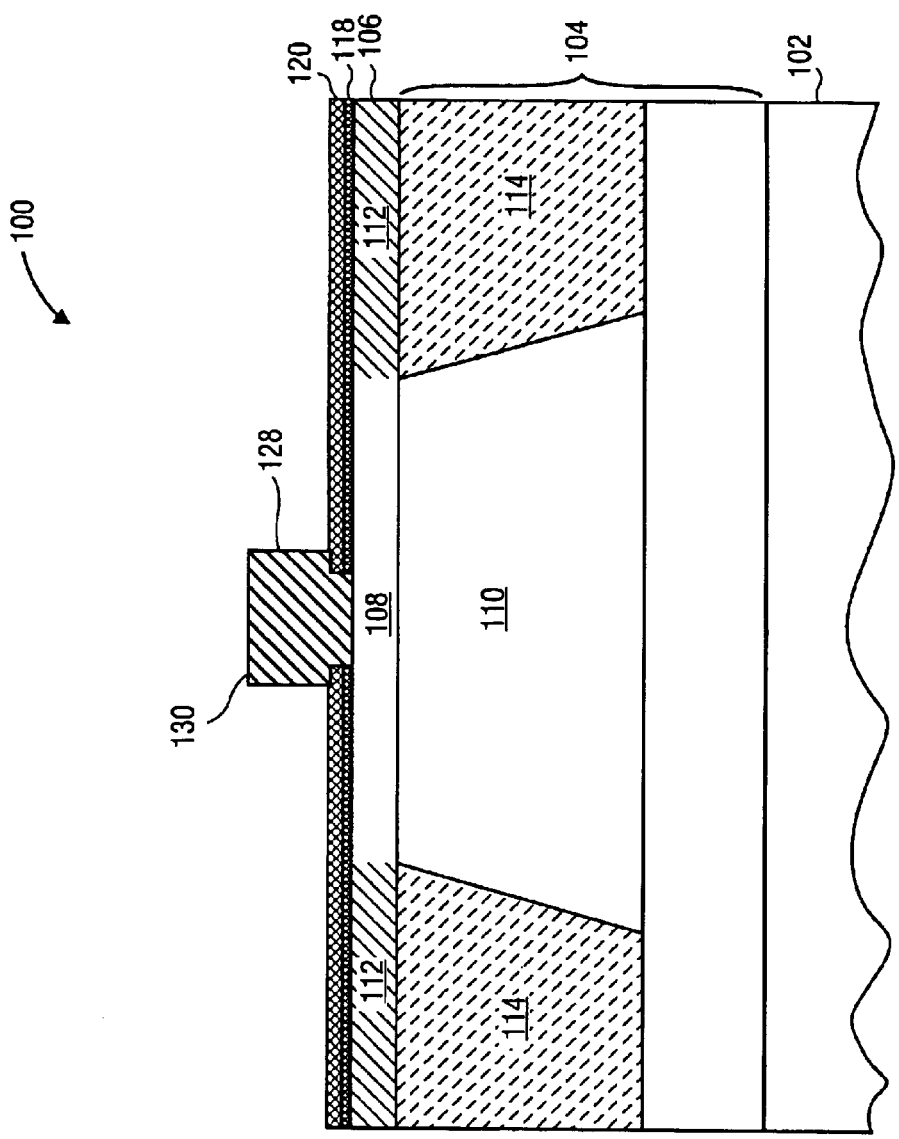
FIG. 3D illustrates a cross-sectional view of the exemplary semiconductor device shown at another subsequent step of the exemplary method of forming the npn bipolar transistor in accordance with the invention.

FIG. 3D illustrates a cross-sectional view of the exemplary semiconductor device 100 at another subsequent step of the exemplary method of forming a bipolar transistor in accordance with the invention. In this subsequent step, the polysilicon emitter 130 is exposed by selectively removing the top silicon dioxide layer 122. In the exemplary method, the sidewalls of the polysilicon layer 128 are exposed as a result of the oxide wet etch.

Figure 3E:
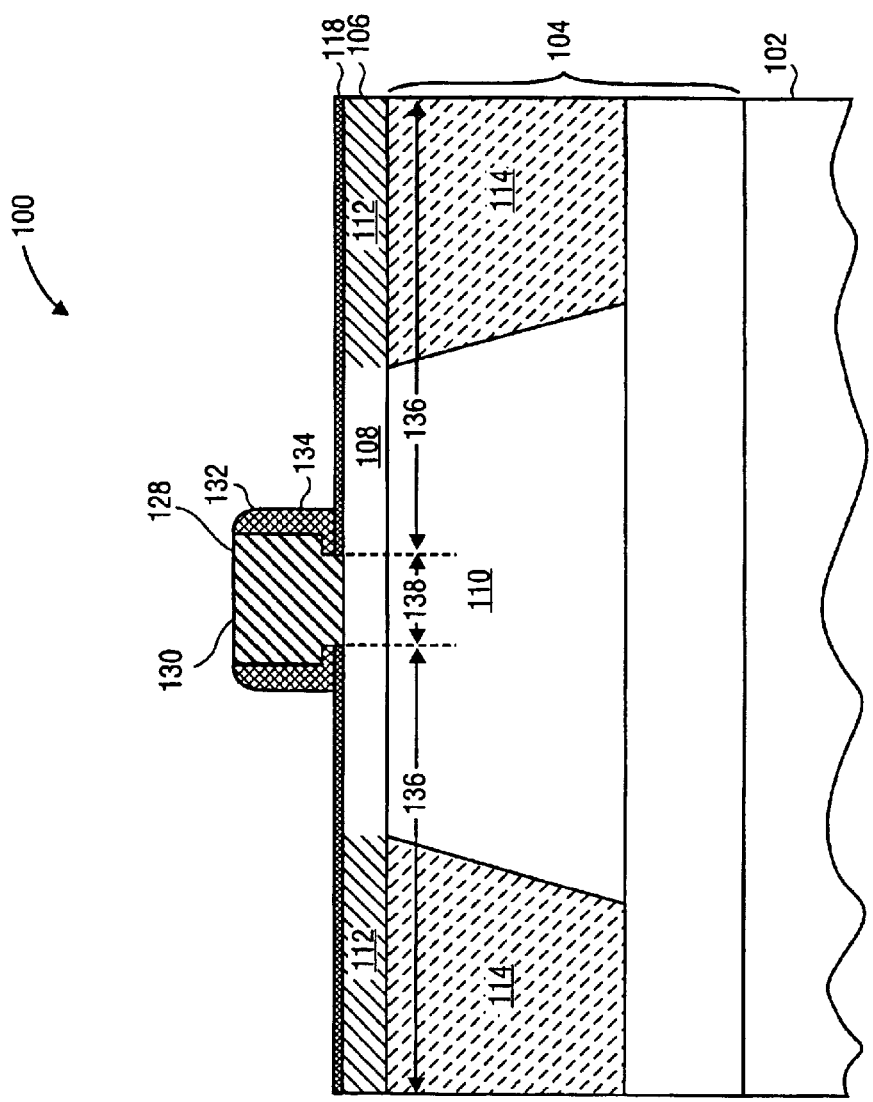
FIG. 3E illustrates a cross-sectional view of the exemplary semiconductor device shown at a subsequent step of the exemplary method of forming the npn bipolar transistor in accordance with the invention.

FIG. 3E illustrates a cross-sectional view of the exemplary semiconductor device 100 at another subsequent step of the exemplary method of forming a bipolar transistor in accordance with the invention. In this subsequent step, a thin nitride spacer 132 adjacent to the polysilicon emitter 130 is formed by depositing a layer of silicon nitride 134 having a thickness in the range of 0.01 microns to 0.1 microns and anisotropically etching the layers of silicon nitride 134. In the exemplary method, the silicon nitride layers 120, 134 are directionally etched with a plasma etcher.

Figure 3F:
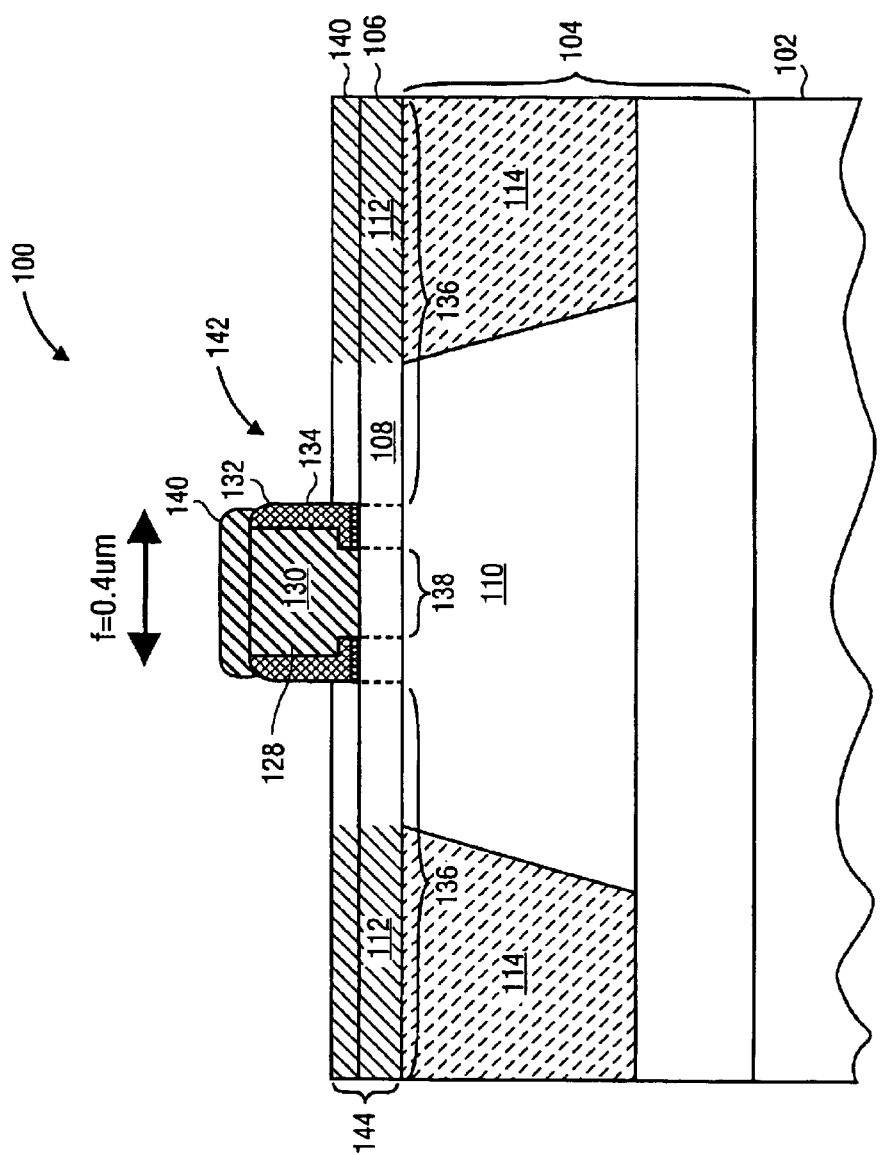
FIG. 3F illustrates a cross-sectional view of the exemplary semiconductor device shown at a subsequent step of the exemplary method of forming the npn bipolar transistor in accordance with the invention.

FIG. 3F illustrates a cross-sectional view of the exemplary semiconductor device 100 at another subsequent step of the exemplary method of forming a bipolar transistor in accordance with the invention. In this subsequent step, the extrinsic base region 136 is raised. The thin silicon dioxide layer 118 is wet etched with HF, and a heavily p-type doped epitaxial layer 140 is selectively deposited at a relatively low temperature over the base epitaxial layer 106 and over the polysilicon emitter 130 (the polysilicon emitter 130 can optionally be protected by a layer of low temperature thermal oxide). In the exemplary method, the epitaxial layer 140 is deposited in a chemical vapor epitaxy device wherein heating elements raise a susceptor to a temperature between 650 to 750° C. Gases such as silane ($SiH_4$), a boron-containing gas and, optionally, germane ($GeH_4$) are introduced into a process chamber. Germane is typically introduced to improve the selectivity of the deposition on silicon relative to nitride. Percentage of germane is gradually reduced to near zero percent (between 0.5 percent and 0 percent) such that the percentage by mole fraction of germane gas to silane gas decreases from about 5 to 10 percent near the beginning of the expitaxy process to less than 1 percent near the end of the epitaxy process.

Once the SiGe seed is formed, the germane concentration may be reduced while still providing epitaxy without increasing the temperature in the reactor. The reduction of the germane concentration causes the Ge concentration to diminish near the surface of the raised extrinsic base 136. As a result, it is easier to form silicides on the top portion of the raised extrinsic base 136. As an option, a self-aligned silicide formation of the extrinsic base region 136 and emitter region 142 may be performed (not shown).

Figure 3G:
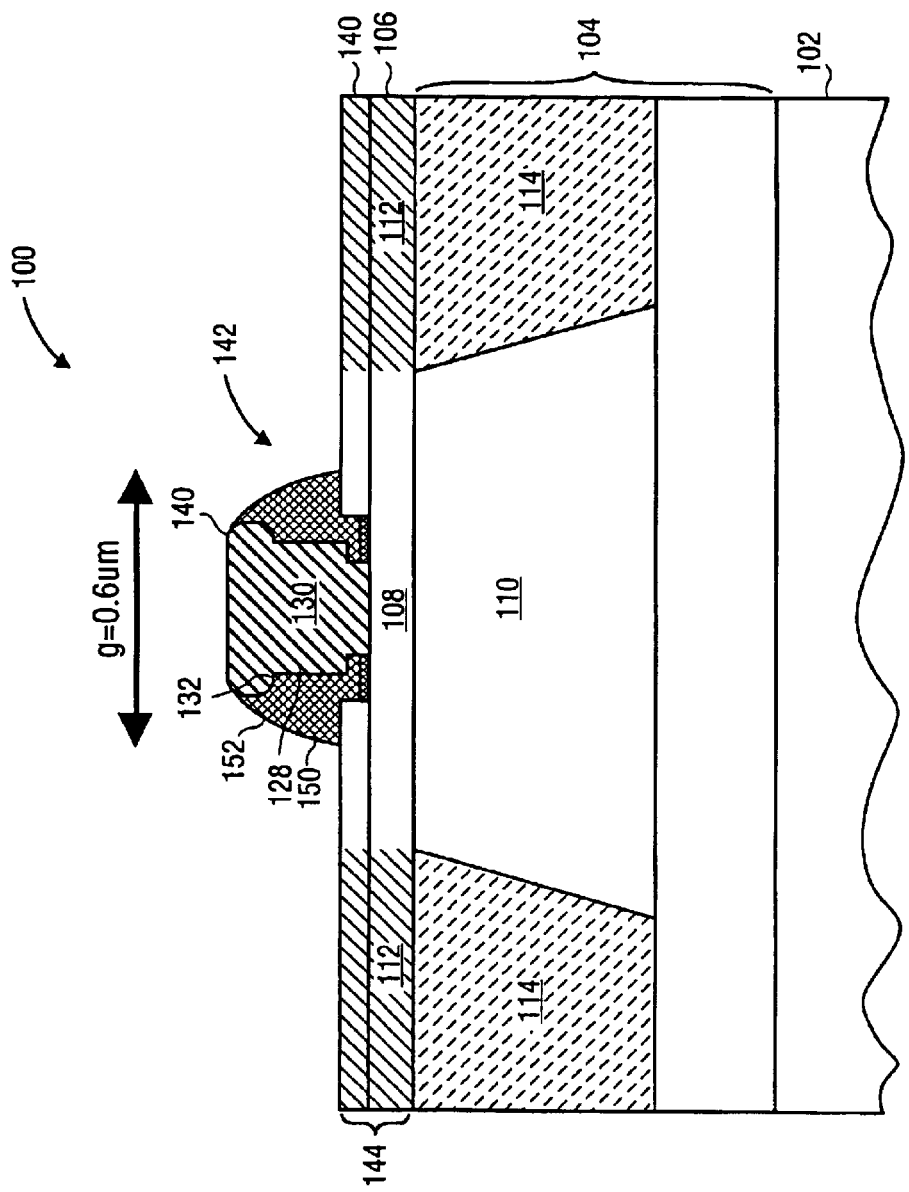
FIG. 3G illustrates a cross-sectional view of the exemplary semiconductor device shown at a subsequent step of the exemplary method of forming the npn bipolar transistor in accordance with the invention.
Figure 3H:
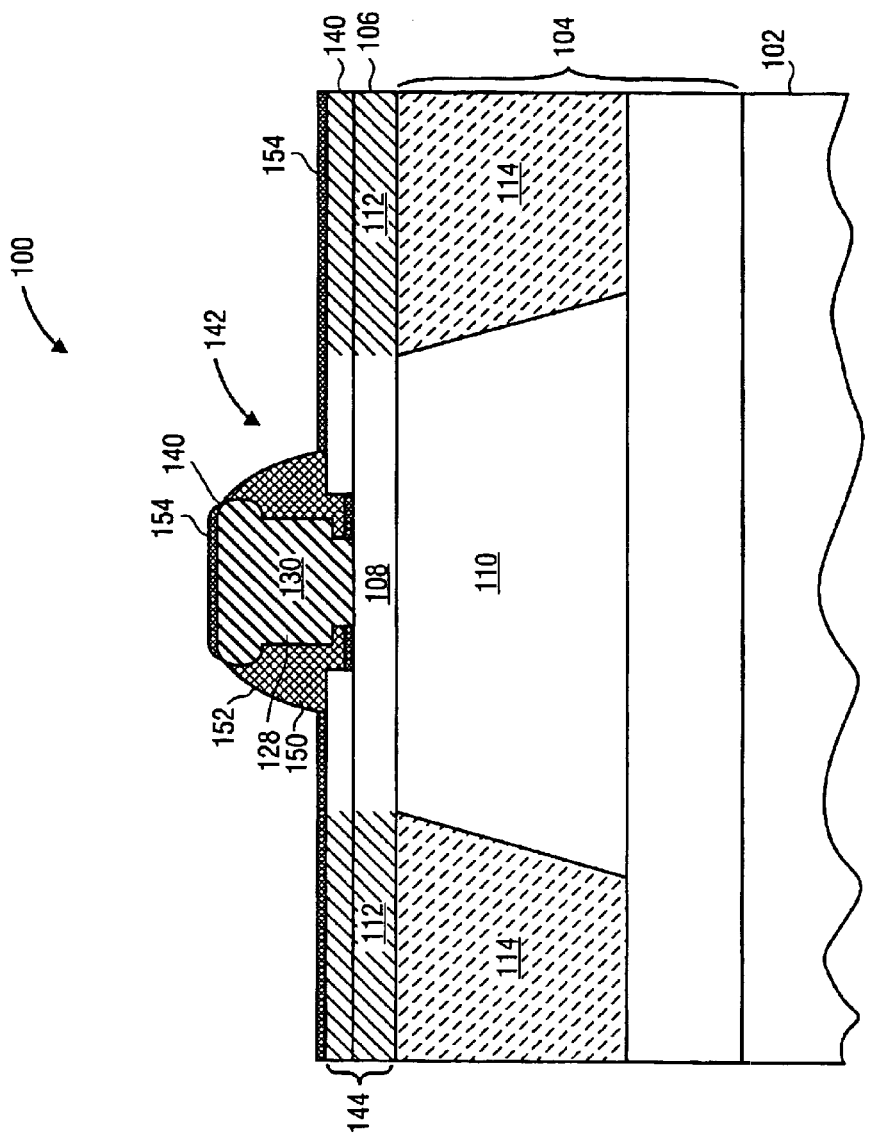
FIG. 3H illustrates a cross-sectional view of the exemplary semiconductor device shown as a subsequent step of the exemplary method of forming the npn bipolar transistor in accordance with the invention.

FIG. 3G illustrates a cross-sectional view of the exemplary semiconductor device 100 at another subsequent step of the exemplary method of forming a bipolar transistor in accordance with the invention. In this subsequent step, the thickness of the thin nitride spacer 132 is increased to a thickness on the order of about 0.1 microns to increase the width of the emitter region 142 in order to prevent the emitter silicide layer from shorting with the base silicide layer and in order to prevent the emitter contact etch exposing the base region 144. The thickness of the thin nitride spacer 132 is increased to form the nitride spacer 150 by forming a conformal silicon nitride layer 152 on the substrate 102 and selectively etching back the silicon nitride layer 152. In the exemplary method, the silicon nitride layer 152 is etched back by a reactive ion etch FIG. 3H illustrates a cross-sectional view of the exemplary semiconductor device 100 at another subsequent step of the exemplary method of forming a bipolar transistor in accordance with the invention. In this subsequent step, a silicide layer 154 is formed at the surface of the raised extrinsic base region 144 and the top surface of the emitter region 142.

Figure 3I:
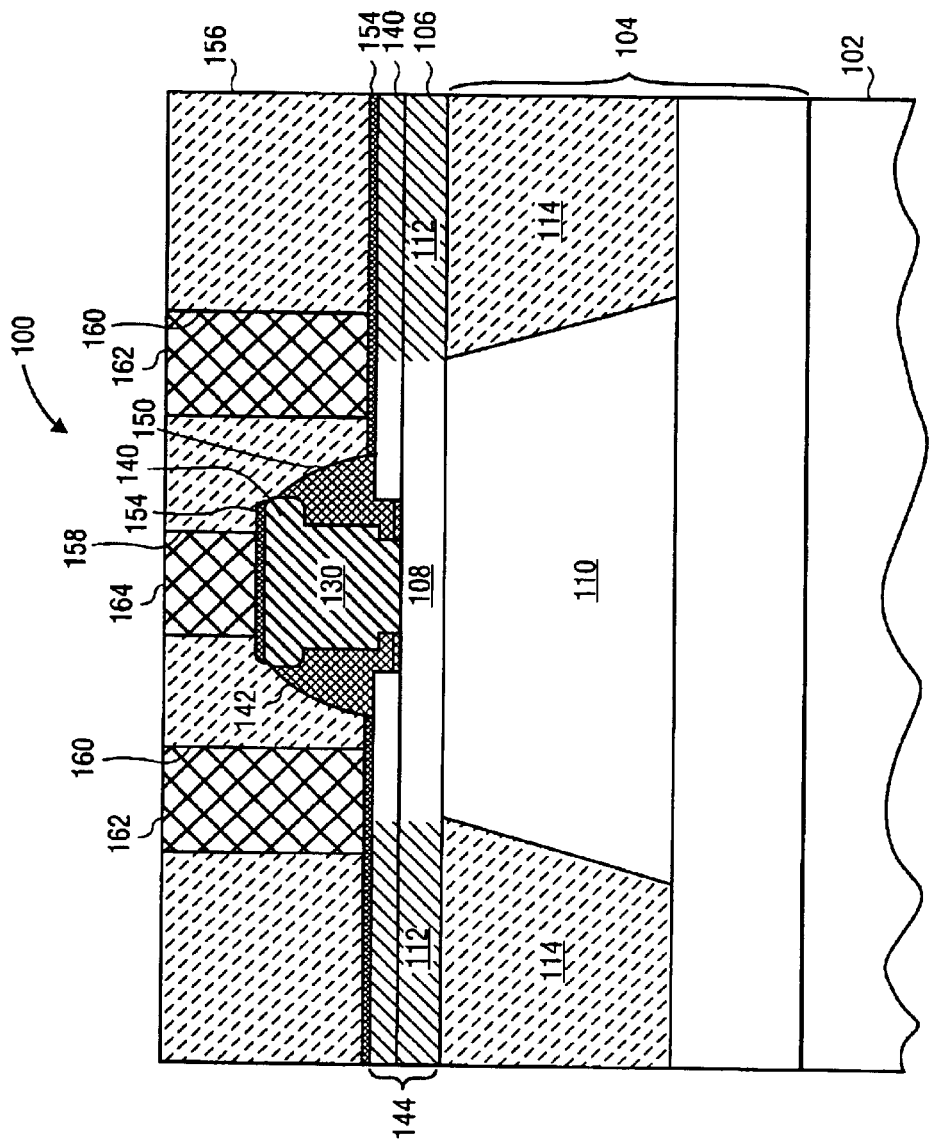
FIG. 3I illustrates a cross-sectional view of the exemplary semiconductor device shown as a subsequent step of the exemplary method of forming the npn bipolar transistor in accordance with the invention.

FIG. 3I illustrates a cross-sectional view of the exemplary semiconductor device 100 at another subsequent step of the exemplary method of forming a bipolar transistor in accordance with the invention. The surface of the substrate 102 is coated with an interlayer insulating film 156 such as silicon dioxide and planarized. An emitter contact window 158, base contact window 160, and collector contact window (not shown) are patterned and etched through the interlayer insulating film 156, and base contacts 162, an emitter contact 164, and collector contact (not shown) are formed.

In the foregoing specification, the invention has been described with reference to specific embodiments thereof. It will, however, be evident that various modifications and changes may be made thereto departing from the broader spirit and scope of the invention. For example, the raised base approach can be adapted to work in various schemes utilizing the sacrificial emitter feature. The specification and drawings are, accordingly, to be regarded in an illustrative rather than a restrictive case.

What is claimed is:

1. A method of forming a bipolar transistor, comprising:
   providing a substrate;
   forming a first epitaxial layer over the substrate to form a base region having an intrinsic base region and an extrinsic base region;
   forming an emitter stack over the substrate including
      forming a first oxide layer over the first epitaxial layer,
      forming a first nitride layer over the first oxide layer,
      forming a second oxide layer over the first nitride layer,
      patterning an emitter mask layer over the second oxide layer,
      selectively etching the second oxide layer and the first nitride layer to form an emitter window,
      ion implanting through the emitter window, wherein the ion implant is a self-aligned collector implant,
      forming a polysilicon layer over the substrate,
      etching back the polysilicon layer, wherein the top surface of the polysilicon layer is coplanar with or recessed below the top surface of the second oxide layer, and
      selectively removing the second oxide layer to expose an emitter polysilicon structure; and,
   raising the extrinsic base region by forming a second epitaxial layer on the first epitaxial layer.

2. The method of claim 1, further comprising:
   forming a second nitride layer on the substrate; and
   anisotropically etching the first nitride layer and the second nitride layer to form a thin nitride spacer.

3. The method of claim 2, wherein
   said raising the extrinsic base region by forming the second epitaxial layer on the first epitaxial layer further comprises:
      placing the substrate in a chemical vapor epitaxy device;
      heating the substrate to a relatively low temperature to minimize diffusion; and
      introducing a silicon-containing gas, and diborane or other boron containing gas.

4. The method of claim 3, wherein
   said raising the extrinsic base region by forming the second epitaxial layer on the first epitaxial layer further comprises:
      introducing germane with a gradual reduction in germane gas flow to achieve a graded Ge profile in the second epitaxial layer.

5. The method of claim 3, wherein said introducing silane and germane comprises
   a mole fraction of germane to silane ranging from about 5 to 10 percent.

6. The method of claim 4, wherein
   said gradually reducing the percentage of germane while depositing the second epitaxial layer comprises
   reducing the mole fraction of germane from about 5–10 percent to less than 1 percent.

7. The method of claim 2, further comprising:
   forming a third nitride layer on the substrate; and
   etching back the third nitride layer to increase the thickness of the thin nitride spacer to form a nitride spacer, wherein the width of the emitter region is increased from f to g when forming the nitride spacer.

8. The method of claim 7, further comprising:

forming a silicide layer on the second epitaxial layer and the polysilicon emitter structure;

forming an interlayer insulating film on the substrate;

patterning and etching the interlayer insulating film to form an emitter contact window, a base contact window, and a collector contact window; and forming an emitter contact, a base contact, and a collector contact.

9. A method of forming a bipolar transistor, comprising:

providing a substrate;

forming a first epitaxial layer over the substrate to form a base region having an intrinsic base region and an extrinsic base region;

forming an emitter stack over the substrate; and raising the extrinsic base region by forming a second epitaxial layer on the first epitaxial layer including placing the substrate in a chemical vapor epitaxy device;

heating the substrate to a relatively low temperature to minimize diffusion;

introducing a silicon-containing gas, diborane, and, germane; and gradually reducing the percentage of the germane while depositing the second epitaxial layer.

10. The method of claim 9, wherein said heating the substrate to a relatively low temperature comprises heating the substrate to a temperature ranging from 650 to 750° C.

11. The method of claim 9, wherein said gradually reducing the percentage of germane while depositing the second epitaxial layer comprises reducing the mole fraction of germane from about 5–10 percent to less than 1 percent.

12. The method of claim 1, wherein the polysilicon layer over the substrate is an n-type doped polysilicon layer.

13. The method of claim 1, further comprising:

prior to raising the extrinsic base region by forming the second epitaxial layer on the first epitaxial layer, forming a dielectric spacer around the emitter stack.

14. The method of claim 3, wherein the silicon-containing gas is silane.

15. The method of claim 3, wherein said raising the extrinsic base region by forming the second epitaxial layer on the first epitaxial layer further comprises:

removing a silicon dioxide layer.

16. The method of claim 9, wherein the second epitaxial layer is selectively deposited on the first epitaxial layer.

17. The method of claim 9, wherein the silicon-containing gas is silane.

* * * * *